United States Patent [19]

Bice et al.

[11] 4,414,837

[45] Nov. 15, 1983

[54] APPARATUS AND METHODS FOR THE SHUNT CALIBRATION OF SEMICONDUCTOR STRAIN GAGE BRIDGES

[75] Inventors: James W. Bice, Wayne; Charles L. Gravel, River Edge; Harold Bernstein, Hillsdale, all of N.J.

[73] Assignee: Arthur L. Plevy, Edison, N.J.

[21] Appl. No.: 348,919

[22] Filed: Feb. 16, 1982

[51] Int. Cl.³ ............................................. G01L 25/00
[52] U.S. Cl. .......................................... 73/1 B; 73/766
[58] Field of Search ..................... 73/1 B, 766, 862.63, 73/862.67, 708

[56] References Cited

U.S. PATENT DOCUMENTS

| | | | |
|---|---|---|---|
| 3,046,782 | 7/1962 | Laimins | 73/862.63 |
| 3,074,175 | 1/1963 | Ludlan | 73/766 X |
| 3,130,578 | 4/1964 | Ames, Jr. | 73/766 |
| 3,490,272 | 1/1970 | Russell | 73/766 |
| 4,172,389 | 10/1979 | Branch | 73/766 |
| 4,333,349 | 6/1982 | Mallon et al. | 73/708 |

FOREIGN PATENT DOCUMENTS 420868  8/1974  U.S.S.R. ................................. 73/766

*Primary Examiner*—Charles A. Ruehl
*Assistant Examiner*—Tom Noland
*Attorney, Agent, or Firm*—Arthur L. Plevy

[57] ABSTRACT

There is disclosed an apparatus and a technique for shunt calibration of a Wheatstone bridge array independent of temperature. The structure involves a side completion half bridge array which has two temperature sensitive resistors as semiconductor strain gages forming one arm of the bridge and two temperature insensitive resistors forming the other arm of the bridge. An input voltage is applied to two opposite terminals of the bridge via equal span resistors and an output is taken between the common terminals of each of the bridge arms. A calibration resistor is positioned to shunt a span resistor and a temperature insensitive resistor to provide a calibrated output voltage of a magnitude independent of temperature.

11 Claims, 1 Drawing Figure

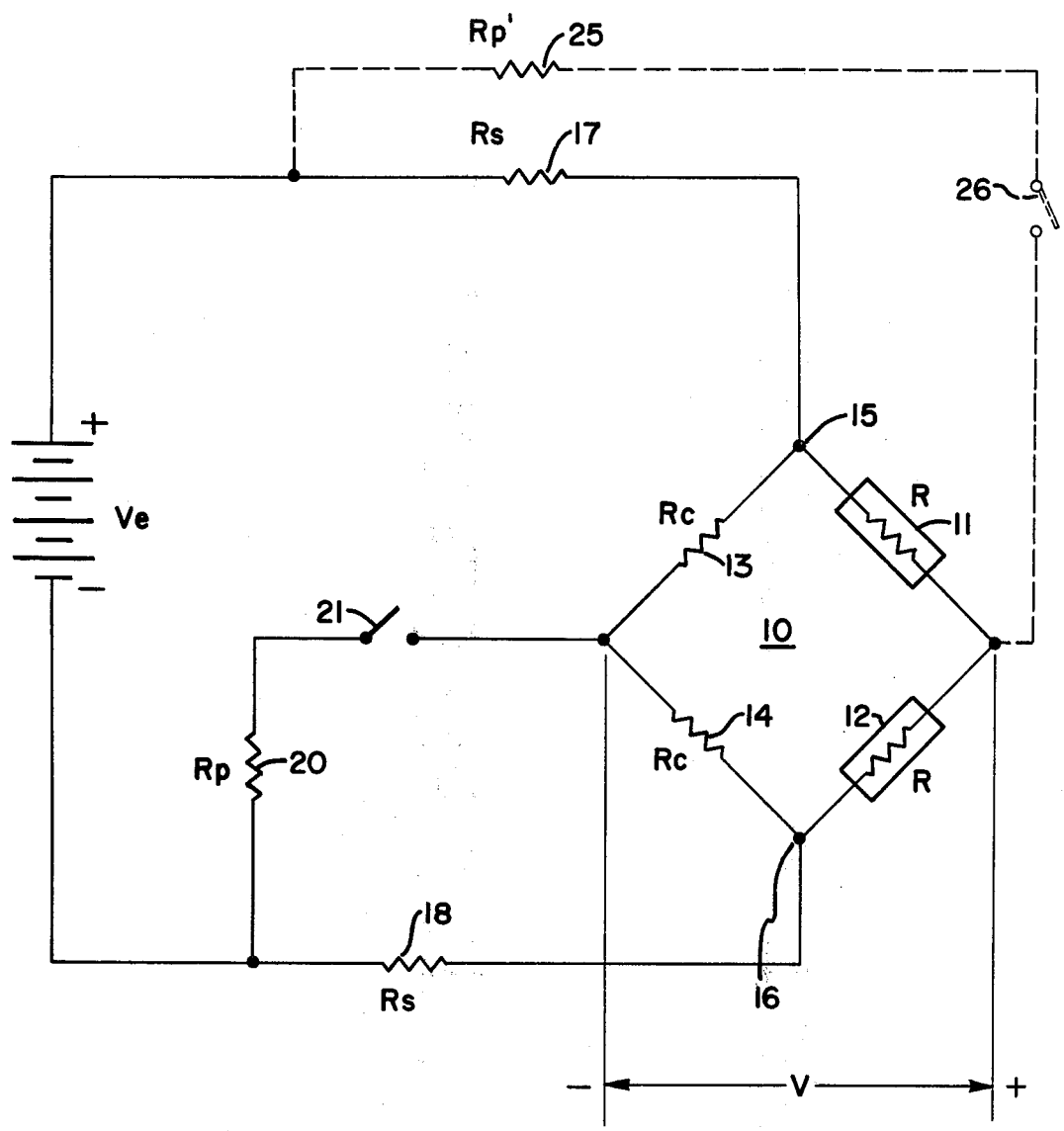

APPARATUS AND METHODS FOR THE SHUNT CALIBRATION OF SEMICONDUCTOR STRAIN GAGE BRIDGES

BACKGROUND OF INVENTION

This invention relates to semiconductor strain gage bridges and more particularly to an improved apparatus and method for calibrating such a bridge.

The Wheatstone bridge is a very popular circuit configuration and has been extensively employed as the measurement circuit in conjunction with a wide variety of transducers. The bridge configuration has been employed with suitable transducers for the measurement of pressure, temperature and in a host of other applications.

In the field of pressure transducers the four-arm Wheatstone bridge is widely employed. See for example U.S. Pat. No. 4,236,137 issued on Nov. 25, 1980 to A. D. Kurtz, et al. and entitled SEMICONDUCTOR TRANSDUCERS EMPLOYING FLEXURE FRAMES, as well as many other patents showing a typical bridge structure.

In employing such a bridge configuration both the user and manufacturer would desire to calibrate the bridge as well as associated circuitry coupled to the bridge in order to determine the full operating range. The technique is referred to as shunt calibration. In this technique a shunt resistor is applied across the arms of the bridge or across an element and is operative to load the output of the bridge so that the bridge will provide a voltage which is conventionally 80% of full scale voltage with a given excitation voltage applied to the bridge. Of course other values of shunt calibration signal levels may be employed as is convenient for a given application. The shunt resistor is added externally and the process is to calibrate the bridge and the associated system. Thus the output of the system is calibrated from a zero point to a value of 80% of full scale. In regard to pressure transducer using a Wheatstone bridge array, this may correspond to a typical voltage level of zero to 100 millivolts.

Shunt calibration is a method of checking the response of a transducer and works well with conventional bridge configurations which use sensor devices that are not affected by or have minimal temperature effects such as conventional metallic or wire strain gage bridges. However the shunt calibration technique does not work well with piezoresistive sensors which are semiconductor devices. As is well-known, such devices exhibit a change in resistance with temperature. Therefore, in using semiconductor devices, the shunt resistor has a different effect at each different temperature. Accordingly, there is no technique presently understood which would conveniently enable one to shunt calibrate a semiconductor bridge configuration independent of temperature.

There are of course many prior art techniques which attempt to temperature compensate such a bridge, but they do not allow for shunt calibration independent of temperature. See for example, U.S. Pat. No. 3,245,252 entitled TEMPERATURE COMPENSATED SEMICONDUCTOR STRAIN GAGE UNIT issued on Apr. 12, 1966 to D. F. First, et al.

It is therefore an object of the present invention to provide an improved apparatus and method of shunt calibration of a semiconductor transducer independent of temperature.

BRIEF DESCRIPTION OF THE PREFERRED EMBODIMENT

In a Wheatstone bridge array of the type having a first arm comprising first and second temperature sensitive resistors in a series path between first and second terminals, and a second arm comprising third and fourth temperature insensitive resistors in a series path between said terminals and in parallel with said first arm, with an output voltage taken between the junction of said first and second resistors and the junction between said third and fourth resistors, the combination therewith of apparatus for shunt calibrating said array relatively independent of temperature, comprising means for applying a biasing potential between said first and second terminals, selectively operable shunt calibration means operative to shunt one of said temperature insensitive resistors in a first selectable position to cause said array to provide a calibrated output voltage independent of temperature.

BRIEF DESCRIPTION OF THE FIGURE

The sole FIGURE is schematic circuit of a bridge array employing shunt calibration according to this invention.

DETAILED DESCRIPTION OF THE FIGURE

Referring to the FIGURE, there is shown a Wheatstone bridge array 10. The bridge configuration 10 is a half bridge configuration with a side arm completion. Thus as shown in the FIGURE, resistors 11 and 12 which constitute one side of the bridge 10 are piezoresistors and thus are semiconductor devices which will exhibit a desirable varying resistance upon application of a force and an undesirable variation of resistance upon application of temperature to a diaphragm or membrane upon which the resistors 11 and 12 are mounted.

The piezoresistive effect is well-known in the prior art and there are many techniques for manufacturing and implementing such semiconductor strain gages. As is well-known, the semiconductor strain gage such as 11 and 12 exhibit a change in resistance in regard to a change in temperature. Therefore the value of resistors 11 and 12 vary as a function of temperature.

In order to complete the Wheatstone bridge configuration a second arm consists of resistors 13 and 14. According to the principles of this invention, resistors 13 and 14 are selected to complete the bridge by forming the corresponding side arm. Resistors 13 and 14 also designated as "Rc" are selected of the same magnitude and are temperature insensitive. Such resistors are well-known and for example, may include thick film or thin film resistors or resistors fabricated from platinum, as well as many other substances which provide extremely small temperature coefficients. In this manner the value of resistors 13 and 14 will not vary with temperature as does the value of the piezoresistive semiconductor elements 11 and 12 also designated as "R".

The output from the bridge designated as "V" is taken between the junctions formed by the common connections of resistors 11 and 12 and the junction formed by the connection of resistors 13 and 14. In order to bias the bridge, a battery or source of voltage Ve is applied to terminals 15 and 16 of the bridge via span resistors 17 and 18, also designated as "Rs". The purpose of resistors 17 and 18 is to provide a relatively constant current to the bridge configuration. The magnitude of resistors 17 and 18 are selected typically to be equal for maximum common mode rejection. These resistors serve to provide sensitivity compensation for temperature for the semiconductor strain gage bridge but one or both resistors may be eliminated as required by the application while still allowing for temperature insensitive shunt calibration by this invention.

Shown in the FIGURE is a shunt resistor 20 designated as "Rp". The shunt resistor 20 is connected to the negative terminal of the battery and via a switch 21 to the common terminal between resistors 13 and 14. Hence as depicted in the FIGURE when switch 21 is closed the shunt resistor 20 serves to shunt resistor 14 and resistor 18.

Shunt calibration of a Wheatstone bridge containing semiconductor strain gages is the process of unbalancing the bridge with a predetermined resistor as resistor 20. The function of resistor 20 is to shunt one of the arms of the bridge to achieve a given output voltage that simulates the effect of an applied mechanical load. For example, the full scale output of the bridge 10 with a given applied biasing voltage Ve may be 100 millivolts.

In order to calibrate the bridge the resistor 20 is selected to provide 80% of full scale voltage when it is shunting the appropriate arm. This would correspond to a voltage of 80 millivolts. As indicated, the semiconductor strain gages 11 and 12 possess a resistance which is temperature sensitive. The circuit of the FIGURE operates to provide shunt calibration which is independent of temperature. The operation of the circuit is explained as follows:

As indicated, in order to provide shunt calibration which is temperature independent, the bridge configuration 10 is a side completion half bridge having two temperature insensitive completion resistors 13 and 14 of equal magnitude Rc and two semiconductor strain gage elements 11 and 12 of equal magnitude R. The value of the span resistors 17 and 18 is selected to be equal both being of the same magnitude. The calibration resistor Rp is placed across the combination of a completion and a span resistor as resistors 14 and 18. Thus for the basic circuit shown, the effect of closing the switch 21 places the shunt resistor 20 in circuit to provide an output voltage V for a given excitation voltage Ve according to the following equation:

$$V = \frac{VeRc}{2(2Rp + Rc + Rs)} \quad (1)$$

$$Rp = Rc(Ve/V) - \tfrac{1}{2}(Rc+Rs) \quad (2)$$

Thus as can be seen from the above equation 1 and 2, the gage resistance R which is a function of temperature does not appear. The calibration output voltage V is therefore a constant and is independent of temperature.

Also shown in the FIGURE is a dashed line path which includes a shunt resistor 25 designated as Rp'. The resistor 25 is also arranged via switch 26 to shunt an arm of the bridge which includes the temperature sensitive resistor 11. The output voltage in regard to the arrangement using resistor 25 is then calculated according to the following equation:

$$V = \frac{VeR}{2(2Rp' + R + Rs)} \quad (3)$$

As can be seen from equation 3, the calibration voltage V is a function of R and therefore varies with temperature. A semiconductor strain gage has a resistance which increases approximately linearly with temperature at the rate of about 20% per 100 degrees Fahrenheit. The output voltage V will also increase at about that rate and this renders such a technique unsuitable for shunt calibration.

Therefore, while the circuit configuration is the same it is extremely important to position the shunt resistor correctly in order to provide shunt calibration which is not a function of temperature. Thus, in employing the circuit depicted in the FIGURE, the value of resistors 11 and 12 is selected to be 500 ohms. The value of resistors 13 and 14 are selected to be 1000 ohms and the value of resistors 17 and 18 are selected to be 18000 ohms. With these values and using and excitation voltage Ve of 10 volts, one requires a shunt resistor Rp of 11,100 ohms to produce an output voltage of 80 millivolts. This voltage is of course selected to be 80 % of the full scale voltage which is 100 millivolts. It is of course seen that one or both of the series span resistors 17 and 18 could also be removed or made equal to zero and thus the shunt resistor would operate to shunt resistor 14 and still provide an output voltage which is independent of temperature.

Thus in employing the above noted circuit configuration one can achieve shunt calibration in a side completion half bridge array which is temperature insensitive. It is of course understood that the shunt resistor could be positioned across resistors 17 and 12 in lieu of resistors 18 and 14, thus providing a negative calibration signal simulating a negative applied force as for instance in a vacuum or differential transducer.

The advantage of providing shunt calibration according to this technique results in considerable time savings while enabling both the manufacturer and the user to verify the calibration output voltage without considering the effects of temperature.

While the invention has utility in regard to the bridge configurations containing semiconductor strain gages, the techniques described are also applicable to such bridge configuration which contain elements as 11 and 12 which possess a resistance as a function of temperature. For instance, this technique can be used to provide a shunt calibration signal for a temperature transducer where element 12 is a temperature sensitive device such as an RTD and resistors 11, 13 & 14 are temperature insensitive bridge completion resistors.

It will thus be seen that the objects of the present invention have been made apparent and that one skilled in the art will be aware of reasonable modifications and changes without departing from the spirit and scope of this invention as defined by the claims appended hereto.

We claim:

1. In a Wheatstone bridge array of the type having a first side comprising first and second equal temperature sensitive resistors in a series path between first and second terminals, and a second side comprising third and fourth equal temperature insensitive resistors in a series path between said terminals and in parallel with said first side, with an output voltage taken between the junction of said first and second resistors and the junction between said third and fourth resistors, the combination therewith of apparatus for shunt calibrating said array relatively independent of temperature, comprising:

means for applying a biasing potential between said first and second terminals, selectively operable shunt calibration means operative to shunt only one of said temperature insensitive resistors in a first selectable position to cause said array to provide a calibrated output voltage independent of temperature.

2. The combination according to claim 1 wherein said first and second temperature sensitive resistors are semiconductor piezoresistive strain gages.

3. The combination according to claim 1 wherein said means for applying a biasing potential includes a source of potential having one terminal coupled to said first terminal of said array and another terminal coupled to said second terminal of said array.

4. The combination according to claim 3 wherein said means for applying a biasing potential includes first and second span resistors, with said first span resistor in series between said one terminal of said source of potential and said first terminal of said array and said second span resistor in series between said another terminal of said source of potential and said second terminal of said array.

5. The combination according to claim 4 wherein said first and second span resistors are equal in magnitude.

6. A shunt compensated bridge circuit comprising in combination, first and second input biasing terminals, first and second equal temperature sensitive resistors said resistors being semiconductor piezoresistors and connected in series between said biasing terminals, third and fourth equal temperature insensitive resistors connected in series between said biasing terminals, one output terminal connected to the junction between said first and second resistors and one output terminal connected to the junction between said third and fourth resistors, means for applying a biasing potential between said first and second biasing terminals and a shunt resistor means operative to shunt only one of said temperature insensitive resistors to provide an output voltage between said output terminals relatively insensitive to temperature.

7. The shunt compensated bridge circuit according to claim 6 wherein said means for applying a biasing potential includes a first span resistor having one terminal connected to said first biasing terminal and a second span resistor having one terminal connected to said second biasing terminal and a source of potential connected between said other terminals of said first and second span resistors.

8. The shunt compensated bridge circuit according to claim 6 wherein the magnitude of said shunt resistor means is selected to provide an output voltage of 80% of a full scale voltage.

9. A method of shunt calibrating a bridge circuit comprising the steps of:

placing first and second equal temperature sensitive resistors in a series path between first and second terminals, placing third and fourth equal temperature insensitive resistors in a series path between said first and second terminals, applying a biasing potential between said first and second terminals, shunting one of said temperature insensitive resistors with a selected resistor, measuring the output voltage obtained between a first junction formed by the common connection of said first and second resistors and a second junction formed by the common connection of said third and fourth resistors.

10. The method according to claim 9 wherein said first and second resistors are semiconductor piezoresistors.

11. The method according to claim 9 wherein the value of said selected resistor is selected to provide an output voltage between said junctions relatively equal to 80% of a full scale voltage.

* * * * *